(12) United States Patent
Lee

(10) Patent No.: US 7,931,766 B2
(45) Date of Patent: Apr. 26, 2011

(54) FILM ADHESION DEVICE AND FILM ADHESION METHOD

(75) Inventor: Masahiro Lee, Aichi (JP)

(73) Assignee: Tekoko Taping Systems Co., Ltd., Aichi (JP)

( * ) Notice: Subject to any disclaimer, the term of this patent is extended or adjusted under 35 U.S.C. 154(b) by 0 days.

(21) Appl. No.: 12/917,304

(22) Filed: Nov. 1, 2010

(65) Prior Publication Data

US 2011/0045411 A1 Feb. 24, 2011

Related U.S. Application Data

(62) Division of application No. 11/546,576, filed on Oct. 12, 2006, now abandoned.

(30) Foreign Application Priority Data

Jun. 21, 2006 (JP) ................................ 2006-171893

(51) Int. Cl.
*B29C 65/00* (2006.01)
(52) U.S. Cl. ........... 156/64; 156/268; 156/250; 156/248
(58) Field of Classification Search .................... 156/64, 156/268, 250, 248
See application file for complete search history.

(56) References Cited

U.S. PATENT DOCUMENTS

| 6,727,461 | B2 | 4/2004 | Lee | |
|---|---|---|---|---|
| 6,773,536 | B2 | 8/2004 | Lee | |
| 2001/0054892 | A1* | 12/2001 | Takekoshi | ................. 324/158.1 |
| 2004/0157430 | A1 | 8/2004 | Mandal | |
| 2005/0101103 | A1 | 5/2005 | Yamamoto | |
| 2005/0282362 | A1* | 12/2005 | Kobayashi et al. | ........... 438/464 |

FOREIGN PATENT DOCUMENTS

| EP | 0884 766 | 12/1998 |
|---|---|---|
| EP | 1 326 266 | 7/2003 |
| JP | 9-201995 | 8/1997 |
| JP | 11-307616 | 11/1999 |
| JP | 2001-155989 | 6/2001 |
| JP | 2004-047976 | 2/2004 |
| JP | 2004-342876 | 12/2004 |
| JP | 2005-223190 | 8/2005 |
| JP | 2007-043057 | 2/2007 |

* cited by examiner

*Primary Examiner* — Khanh Nguyen
*Assistant Examiner* — Vishal I Patel
(74) *Attorney, Agent, or Firm* — Morgan, Lewis & Bockius LLP

(57) ABSTRACT

A film adhesion device includes a table carrying a semiconductor wafer, a pressing member (pressing roller) which presses a film (photoresist film) onto a surface side of the semiconductor wafer placed on the table, a bumper member provided on an outer peripheral side of the table and including a contact surface which is contacted by the pressing member when the pressing member presses the film, and an elevating support mechanism which supports the bumper member elevatably and positions the bumper member at a predetermined height level.

8 Claims, 8 Drawing Sheets

FILM ADHESION DEVICE AND FILM ADHESION METHOD

This application is a Divisional of Copending U.S. patent application Ser. No. 11/546,576, filed on Oct. 12, 2006, which claims the benefit of Japanese Patent Application No. JP-A-2006-171893 filed on Jun. 21, 2006, both of which are hereby incorporated by reference in their entirety.

BACKGROUND OF THE INVENTION

1. Field of the Invention

The present invention relates to a film adhesion device and a film adhesion method, and more particularly to a film adhesion device and film adhesion method with which a structure having an extremely thin film thickness and a high film thickness can be formed with good yield and excellent thickness precision on a semiconductor wafer.

2. Description of the Related Art

In recent years, microdevices such as microsensors, microactuators, and optical switches formed by integrating minute elements that are created using semiconductor microprocessing techniques have become known as Micro Electro Mechanical Systems (MEMS).

In these microsensors and so on, a structure (for example, a hollow structure or the like) may be formed on a semiconductor wafer. Typically, the structure is formed by coating the semiconductor wafer with photoresist using a method as a roll coater method or spray method, and then performing exposure/removal processing and the like. Note that the thickness of wall portions 151 and a roof portion 152 constituting a structure 150 is extremely thin (30 μm or the like, for example) (see FIG. 17).

However, when photoresist is applied using a roll coater method in the conventional structure forming method described above, pin holes and so on are likely to form when the coating film thickness is reduced, and when the coating film thickness is increased, waves (indicated by the virtual lines in FIG. 17) and so on are likely to form. When the photoresist is applied using a spray method, the coating amount becomes unstable when a coating device is driven and stopped, and hence the yield is poor. Therefore, with the conventional structure forming method described above, it is difficult to form a structure having an extremely thin film thickness while securing a predetermined thickness precision (less than 5% or the like, for example). Defective structures occur particularly often at the two end portions of a semiconductor wafer having a small surface area.

Also, an extremely high degree of precision (for example, thickness precision, variation, impurity concentration, and so on) is required of the material constituting the structure, and it is technically difficult to manufacture a structure having a high film thickness. However, in applications for use in environments having high pressure, high temperature, high humidity, and so on, for example, products requiring structures with a high film thickness are needed.

SUMMARY OF THE INVENTION

The present inventor has discovered that by minimizing the effect on the lower layer portion when a large number of films (particularly photoresist films) constituted by a thin and flexible material are mechanically adhered, another film can be laminated onto the first layer film, and as a result, a high film thickness can be achieved by laminating a large number of layers using a pre-existing thick material rather than a high film thickness material.

The present invention has been designed in consideration of the circumstances described above, and it is an object thereof to provide a film adhesion device and a film adhesion method with which a structure having an extremely thin film thickness and a high film thickness can be formed with good yield and excellent thickness precision on a semiconductor wafer.

The invention has the following structure.

1. A film adhesion device comprising:
a table carrying a semiconductor wafer;
a pressing member which presses a film onto a surface side of said semiconductor wafer placed on said table;
a bumper member provided on an outer peripheral side of said table and comprising a contact surface which is contacted by said pressing member when said pressing member presses said film; and
an elevating support mechanism which supports said bumper member elevatably and positions said bumper member at a predetermined height level.

2. The film adhesion device according to 1 above, further comprising a pressing force adjustment mechanism which adjusts a pressing force of said pressing member in accordance with a pressing surface area of said semiconductor wafer.

3. The film adhesion device according to 2 above, wherein said pressing force adjustment mechanism comprises:
a moving unit which supports said pressing member and is capable of moving along a surface of said semiconductor wafer;
a pressing drive source for displacing said pressing member in a pressing direction; and
a control portion which drive-controls said pressing drive source in accordance with said pressing surface area of said semiconductor wafer.

4. The film adhesion device according to 1 above, wherein said elevating support mechanism comprises:
a rotary member supported so as to be free to rotate about a vertical axis of said table;
a rotation drive source for rotating said rotary member; and
a power transmission portion provided between said rotary member and said bumper member, which raises and lowers said bumper member using the rotation of said rotary member.

5. The film adhesion device according to 4 above, wherein said power transmission portion comprises:
a male screw provided on one of said rotary member and said bumper member; and
a female screw provided on the other of said members and screwed to said male screw.

6. The film adhesion device according to 1 above, wherein said film is a photoresist film.

7. The film adhesion device according to 1 above, wherein said pressing member is a pressing roller.

8. A film adhesion method using the film adhesion device according to 1 above, comprising the steps of:
adjusting said height level of said contact surface of said bumper member by raising or lowering said bumper member using said elevating support mechanism such that said bumper member is positioned at said predetermined height level; and
pressing said film onto said surface side of said semiconductor wafer placed on said table using said pressing member,
wherein, in said pressing step, said pressing member is brought into contact with said contact surface of said height level-adjusted bumper member.

9. The film adhesion method according to 8 above, wherein, in said pressing step, said pressing member is moved along said surface of said semiconductor wafer, and while said pressing member is in motion, said pressing force thereof is adjusted in accordance with said pressing surface area of said semiconductor wafer.

According to the film adhesion device of the present invention, the bumper member is raised and lowered by the elevating support mechanism and thereby positioned at a predetermined height level. The film is then pressed onto the surface side of the semiconductor wafer placed on the table by the pressing member. While pressing the film, the pressing member is brought into contact with the contact surface of the height level-adjusted bumper member.

Hence, while pressing the film, the pressing member is brought into contact with the contact surface of the height level-adjusted bumper member, and therefore the pressing member can be prevented from applying an excessive pressing force to the film. As a result, the film, which is constituted by a thin, flexible material, can be affixed in a multi-layer structure with minimal mechanical stress on the lower layer. Further, the bumper member is raised and lowered by the elevating support mechanism so as to be positioned at a predetermined height level, and hence the film can be adhered to semiconductor wafers having various shapes favorably. As a result, a structure having an extremely thin film thickness and a high film thickness can be formed with good yield and excellent thickness precision on the semiconductor wafer. In particular, the structure can be formed with stability on substantially the entire surface of the semiconductor wafer.

Further, when the pressing force adjustment mechanism is provided for adjusting the pressing force of the pressing member in accordance with the pressing surface area of the semiconductor wafer, the film can be pressed onto substantially the entire surface of the semiconductor wafer with an appropriate pressing force.

Further, when the pressing force adjustment mechanism includes the moving unit, the pressing drive source, and the control portion, the pressing force of the pressing member can be subjected to micro-adjustments with great accuracy in accordance with the pressing surface area of the semiconductor wafer. Moreover, the pressing force adjustment mechanism can be manufactured simply and at a reasonable cost.

When the elevating support mechanism includes the rotary member, the rotation drive source, and the power transmission portion, the rotary member is rotated by the drive force of the rotation drive source, and the bumper member is raised and lowered by the power transmission portion using the rotation of the rotary member. As a result, the bumper member can be raised and lowered automatically and accurately, and thereby positioned at a predetermined height level. Moreover, the elevating support mechanism can be manufactured simply and at a reasonable cost.

When the power transmission portion includes the male screw and the female screw, the bumper member can be raised and lowered even more accurately and positioned securely at the predetermined height level.

When the film is a photoresist film, the photoresist film can be pressed with a more appropriate pressing force.

When the pressing member is a pressing roller, the film can be pressed with a more appropriate pressing force.

According to the film adhesion method of the present invention, the bumper member is raised and lowered by the elevating support mechanism, and thereby positioned at a predetermined height level. Further, the film is pressed onto the surface side of the semiconductor wafer placed on the table by the pressing member. While pressing the film, the pressing member is brought into contact with the contact surface of the height level-adjusted bumper member.

Hence, while pressing the film, the pressing member is brought into contact with the contact surface of the height level-adjusted bumper member, and therefore the pressing member can be prevented from applying an excessive pressing force to the film. As a result, the film, which is constituted by a thin, flexible material, can be affixed in a multi-layer structure with minimal mechanical stress on the lower layer. Further, the bumper member is raised and lowered by the elevating support mechanism so as to be positioned at a predetermined height level, and hence the film can be adhered to semiconductor wafers having various shapes favorably. As a result, a structure having an extremely thin film thickness and a high film thickness can be formed with good yield and excellent thickness precision on the semiconductor wafer. In particular, the structure can be formed with stability on substantially the entire surface of the semiconductor wafer.

Further, when the pressing member is moved along the surface of the semiconductor wafer in the pressing step, and the pressing force thereof is adjusted in accordance with the pressing surface area of the semiconductor wafer while the pressing member is in motion, the film can be pressed onto substantially the entire surface of the semiconductor wafer with an appropriate pressing force.

DETAILED DESCRIPTION OF THE PREFERRED EMBODIMENTS

1. Film Adhesion Device

A film adhesion device according to a first embodiment includes a table, a pressing member, a bumper member, and an elevating support mechanism, to be described below. The film adhesion device may also include a pressing force adjustment mechanism to be described below, for example.

There are no particular limitations on the structure, shape, carrying surface, and so on of the aforementioned table as long as it is capable of carrying a semiconductor wafer.

For example, a table 2 may be formed with an intake passage 13 (see FIG. 3), one end side of which opens onto the carrying surface and the other end side of which is connected to an intake source (an intake pump or the like, for example). In so doing, the semiconductor wafer can be held on the table by suction.

Note that there are no particular limitations on the shape, material, size, and so on of the semiconductor wafer. The semiconductor wafer may be circular, rhomboid (including square, rectangular, and other rhomboid shapes), irregular, and so on, for example.

There are no particular limitations on the structure, shape, material, number, and so on of the aforementioned pressing member as long as it is capable of pressing the applied film onto the surface side of the semiconductor wafer placed on the table.

Examples of the pressing member include a pressing roller, a pressing plate, and so on. A pressing roller is preferable due to its ability to absorb irregularities on the surface side of the semiconductor wafer efficiently when pressing a thin film made of a flexible material. At least a pressing portion of the pressing member may be constituted by an elastic material such as rubber.

Note that there are no particular limitations on the shape, material, functions, and so on of the film as long as it is constituted by a thin (for example, 30 μm or less) and flexible material. The film may be a photoresist film, for example. The film may also be constituted by a material possessing a heat-sensitive adhesive property or a pressure-sensitive adhesive property, for example.

There are no particular limitations on the structure, shape, material, number, and so on of the aforementioned bumper member as long as it is provided on the outer peripheral side of the table and includes a contact surface which is contacted by the pressing member when the pressing member presses the film.

For example, the bumper member may be provided around the entire outer periphery of the table, or in a predetermined site on the outer peripheral side of the table.

There are no particular limitations on the structure, support method, and so on of the aforementioned elevating support mechanism as long as it supports the bumper member elevatably and positions the bumper member at a predetermined height level. The contact surface of the bumper member is normally adjusted to a greater height level than the carrying surface of the table.

Figure 3:
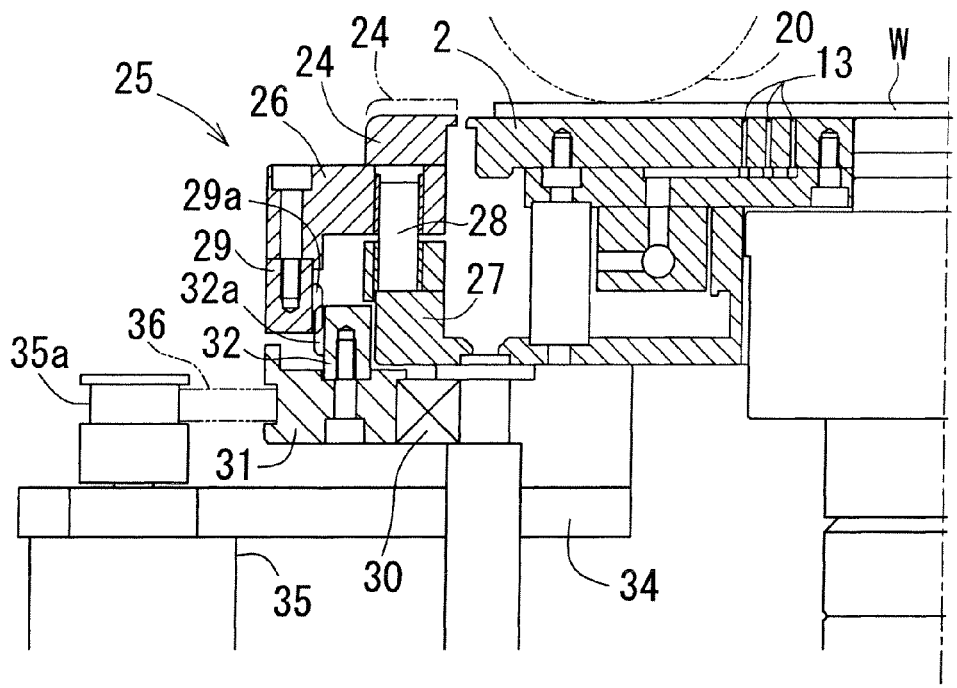
FIG. 3 is an enlarged sectional view of the main parts of FIG. 1.

An elevating support mechanism 25 may include, for example, a rotary member 31 which is supported so as to be free to rotate about the vertical axis of the table 2, a rotation drive source 35 (for example, a drive motor, cylinder, or the like) for rotating the rotary member 31, and a power transmission portion provided between the rotary member 31 and a bumper member 24 for raising and lowering the bumper member 24 using the rotation of the rotary member 31 (see FIG. 3).

Figure 5:
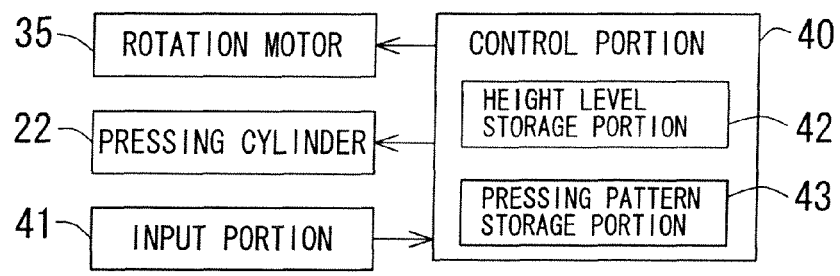
FIG. 5 is a block diagram illustrating a control portion.
Figure 6:
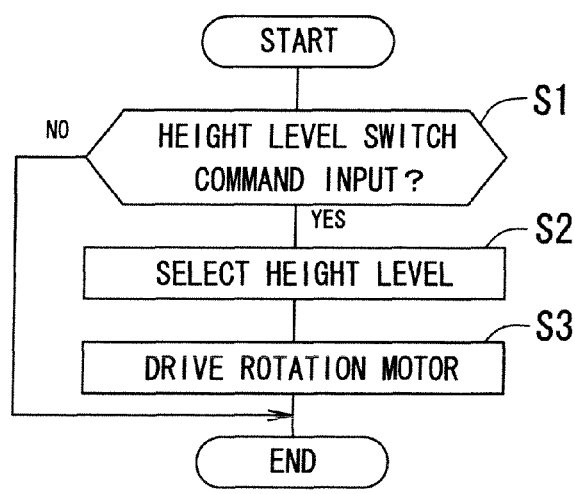
FIG. 6 is a flowchart illustrating height level adjustment processing.

In the case described above, the elevating support mechanism 25 may further include, for example, a height level storage portion 42 storing a plurality of height levels of the bumper member 24 determined in advance in accordance with the planar form and/or surface form of the semiconductor wafer, and a control portion 40 for driving the rotation drive source 35 on the basis of an input height level switch command such that the bumper member 24 is adjusted to a predetermined height level from among the plurality of height levels stored in the height level storage portion 42 (see FIGS. 5 and 6).

The power transmission portion may include, for example, a male screw 32a provided on one of the rotary member 31 and the bumper member 24, and a female screw 29a provided in the other member and screwed to the male screw 32a (see FIG. 3).

There are no particular limitations on the structure, adjustment method, and so on of the aforementioned pressing force adjustment mechanism as long as it adjusts the pressing force of the pressing member in accordance with the pressing surface area of the semiconductor wafer. The phrase "in accordance with the pressing surface area of the semiconductor wafer" denotes that the pressing force per unit pressing surface area of the semiconductor wafer is adjusted to be substantially constant.

Figure 1:
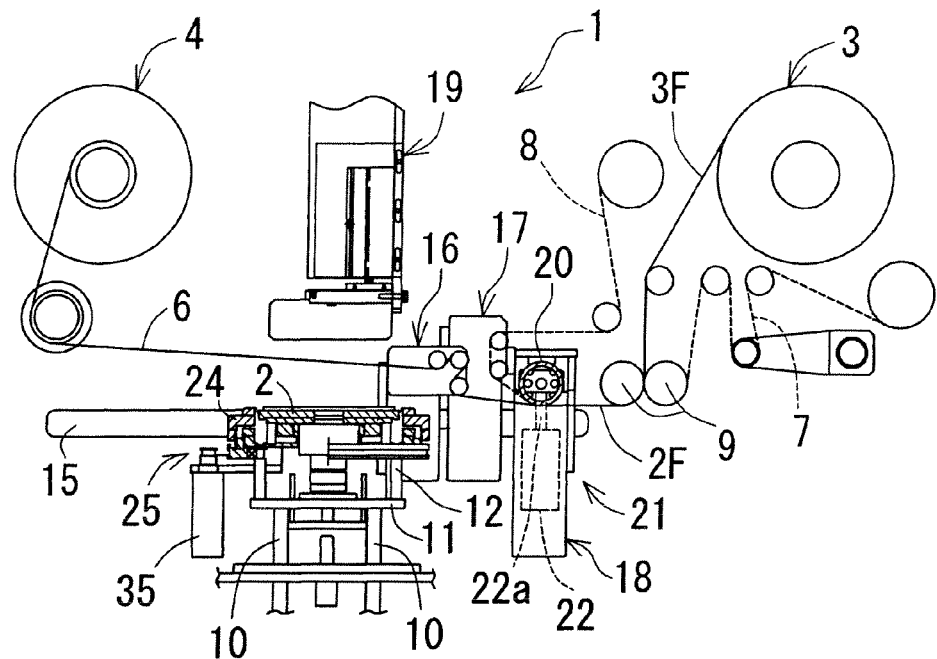
FIG. 1 is an overall side view of a film adhesion device according to a working example.

The pressing force adjustment mechanism 21 may include, for example, a moving unit 18 which supports the pressing member 20 and is capable of moving along the surface of a semiconductor wafer W, a pressing drive source 22 (for example, a drive motor, cylinder, or the like) for displacing the pressing member 20 in a pressing direction, and the control portion 40 for drive-controlling the pressing drive source 22 in accordance with the pressing surface area of the semiconductor wafer W (see FIG. 1).

In the case described above, the pressing force adjustment mechanism 21 may further include, for example, a pressing pattern storage portion 43 storing a plurality of pressing patterns determined in advance in accordance with the planar form and/or surface form of the semiconductor wafer W. Thus, the control portion 40 may drive the pressing drive source 22 on the basis of an input pressing pattern switch command to set a predetermined pressing pattern from among the plurality of pressing patterns stored in the pressing pattern storage portion 43 (see FIGS. 5 and 7).

2. Film Adhesion Method

A film adhesion method according to a second embodiment employs the film adhesion device of the first embodiment described above, and includes a level adjustment step and a pressing step, to be described below.

There are no particular limitations on the adjustment method, timing, and so on of the level adjustment step as long as it involves raising and lowering the bumper member using the elevating support mechanism described above such that the bumper member is positioned at a predetermined height level, and adjusting the height level of the bumper member contact surface.

The level adjustment step may involve, for example, adjusting the height level of a guide surface of the bumper member using an appropriate drive source (a drive motor, cylinder, or the like, for example), or adjusting the height level of the bumper member guide surface using manpower.

In the level adjustment step, the bumper member may be adjusted to a height level corresponding to the planar form and/or surface form of the semiconductor wafer, for example.

There are no particular limitations on the pressing method, timing, and so on of the pressing step as long as it involves pressing the film onto the surface side of the semiconductor wafer placed on the table using the pressing member described above. In the pressing step, the pressing member is brought into contact with the contact surface of the height level-adjusted bumper member.

In the pressing step, the pressing member may be moved along the surface of the semiconductor wafer, and the pressing force thereof may be adjusted during this movement in accordance with the pressing surface area of the semiconductor wafer, for example. In this case, the pressing member may press the film in a pressing pattern which corresponds to the planar form and/or surface form of the semiconductor wafer, for example.

Working Example

A working example of the present invention will now be described with reference to the drawings.

(1) Structure of Film Adhesion Device

Figure 2:
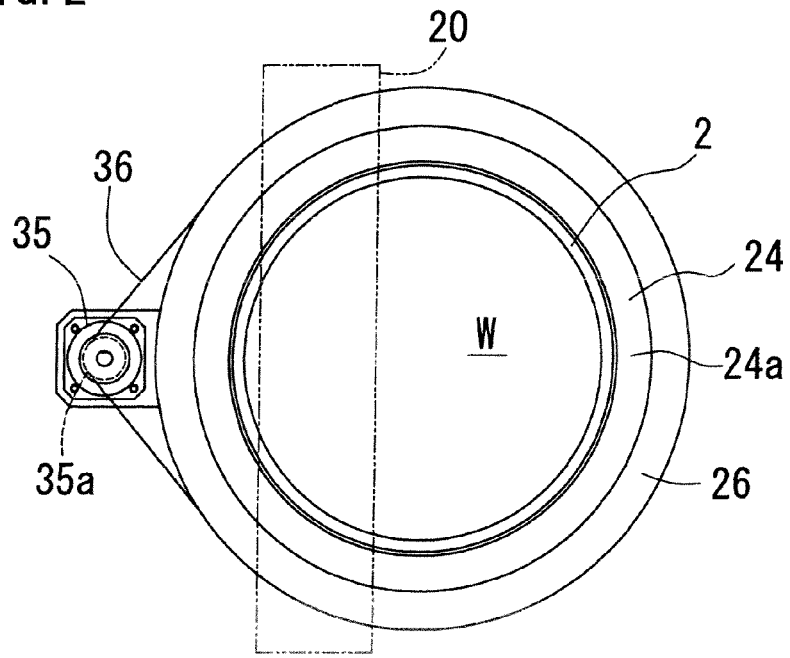
FIG. 2 is a plan view of a table according to this working example.

As shown in FIGS. 1 and 2, a film adhesion device 1 according to this working example includes a disc-shaped table 2 carrying a circular plane-form semiconductor wafer W. A film supply portion 3 and a winding portion 4 forming a pair are disposed at a predetermined interval diagonally above the table 2. A three-layer film F3 is supplied from the film supply portion 3. The three-layer film F3 is constituted by a photoresist film 6 having a heat-sensitive adhesive property with a carrier film 7 laminated onto one surface thereof and a reinforcing film 8 laminated onto the other surface thereof. The carrier film 7 is peeled away from the three-layer film F3 by a P1nch roller 9 such that the three-layer film F3 becomes a two-layer film F2. The two-layer film F2 is pressed onto, and thereby adhered to, the surface of the semiconductor wafer W, whereupon the reinforcing film 8 is peeled away from the two-layer film F2 by the horizontal movement of a moving unit to be described below.

The table 2 is fixed to the tip end side of a plurality of slide rods 10, which are supported elevatably on a frame (not shown), via a substrate 11 and a support portion 12. The table 2 is raised and lowered by raising and lowering the slide rods 10 using the driving force of a drive source (not shown) such as an air cylinder. As shown in FIG. 3, the table 2 is also formed with an intake passage 13, one end side of which opens onto the carrying surface and the other end side of which is connected to an intake source (not shown) such as an intake pump. Through the intake action of the intake source, the semiconductor wafer W can be held on the table 2 by suction.

As shown in FIG. 1, a single slide shaft 15 extending in a horizontal direction is disposed on one side of the table 2. A first moving unit 16, a second moving unit 17, and a third moving unit 18 are supported slidably on the slide shaft 15. The first through third moving units 16, 17, and 18 are moved horizontally by the driving force of a drive source (not shown) such as an air cylinder. Further, a cutting unit 19 for trimming the photoresist film 6 adhered to the semiconductor wafer W using a laser is provided above the table 2 so as to be capable of moving in the horizontal plane.

Figure 8:
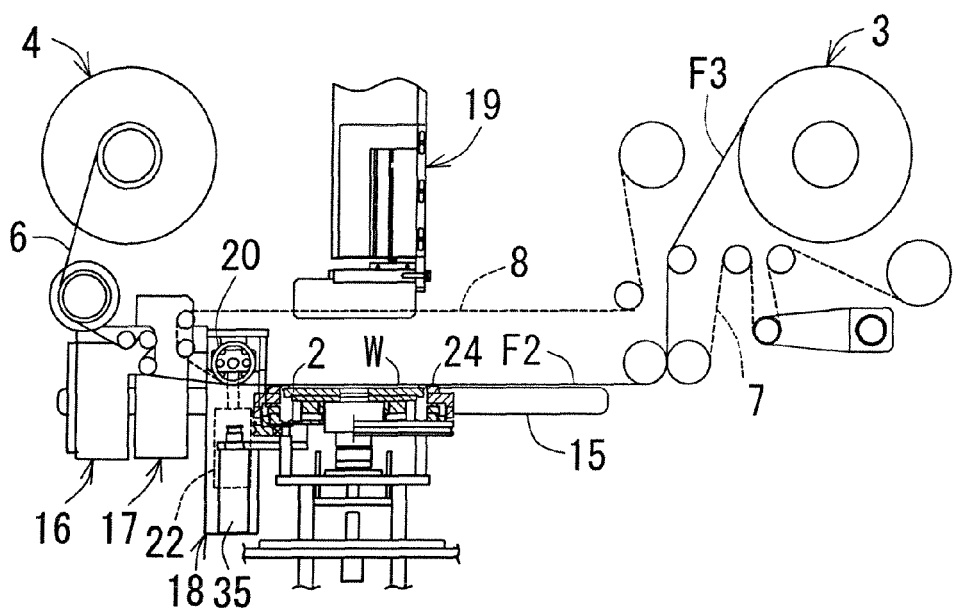
FIG. 8 is an illustrative view showing the actions of the film adhesion device.

The third moving unit 18 includes a pressing roller 20 (corresponding to the pressing member of the present invention) which presses the photoresist film 6 onto the surface side of the semiconductor wafer W on the table 2. At least a roller surface portion of the pressing roller 20 is constituted by an elastic material such as rubber. When the first through third moving units 16, 17, and 18 are moved together from a position on one end side of the slide shaft 15 (see FIG. 1) to the other end side of the slide shaft 15, as shown in FIG. 8, the two-layer film F2 supplied by the film supply portion 3 is applied to the surface side of the semiconductor wafer W on the table 2, and at the same time, the two-layer film F2 is pressed onto and adhered to the surface of the semiconductor wafer W by the pressing roller 20 of the third moving unit 18.

The pressing force of the pressing roller 20 is adjusted in accordance with the pressing surface area of the semiconductor wafer W by a pressing force adjustment mechanism 21. The pressing force adjustment mechanism 21 includes a pressing cylinder 22 (corresponding to the pressing drive source of the present invention) having a Plston rod 22a whose tip end side is connected to a support member (not shown) which supports the pressing roller 20 rotatably (see FIG. 1). The pressing cylinder 22 is supplied with an amount of fluid corresponding to the pressing surface area of the semiconductor wafer W by a fluid supply source such as a pump to minutely adjust the rising and falling operation of the Piston rod 22a.

As shown in FIGS. 2 and 3, an annular bumper member 24 is provided on the outer peripheral side of the table 2. The bumper member 24 includes a contact surface 24a which is contacted by the pressing roller 20 when pressing the photoresist film 6. The bumper member 24 is supported elevatably and positioned at a predetermined height level by an elevating support mechanism 25.

The elevating support mechanism 25 includes a ring member 26 which is screwed to the lower surface side of the bumper member 24. The ring member 26 is supported elevatably by a support member 27 formed integrally with the table 2 via a plurality of support shafts 28. Further, a ring member 29 having a female screw 29a formed in its inner peripheral surface is screwed to the lower end side of the outer periphery of the ring member 26. A rotary member 31 is supported by the support member 27 via a bearing 30 so as to be free to rotate about the central axis of the table 2. A ring member 32 having a male screw 32a, which is screwed to the female screw 29a, formed on its outer peripheral surface is screwed to the upper surface side of the rotary member 31. Further, a rotation motor 35 (corresponding to the rotation drive source of the present invention) is fixed to the support member 27 via an attachment Piece 34. A transmission belt 36 is wrapped around a drive shaft 35a of the rotation motor 35 and an outer peripheral groove in the rotary member 31. Thus, the rotary member 31 is rotated by driving the rotation motor 35, and as a result, the bumper member 24 is raised and lowered by the engagement between the female screw 29a and the male screw 32a (corresponding to the power transmission portion of the present invention).

As shown in FIG. 5, the film adhesion device 1 includes a control portion 40 for controlling various processing operations relating to film adhesion. The rotation motor 35, the pressing cylinder 22, and an input portion 41 (for example, a keyboard, a mouse, a fingertip operating portion, or the like) are connected to the control portion 40. The control portion 40 further includes a height level storage portion 42 storing a plurality of height levels of the bumper member 24 determined in advance in accordance with the planar form and/or surface form of the semiconductor wafer W, and a pressing pattern storage portion 43 storing a plurality of pressing patterns determined in advance in accordance with the planar form and/or surface form of the semiconductor wafer W.

The control portion 40 determines whether or not a height level switch command has been input through the input portion 41 (see step S1 of FIG. 6). When a height level switch command has been input through the input portion 41 (a determination of YES in step S1), the control portion 40 selects a predetermined height level corresponding to the switch command from among the plurality of height levels stored in the height level storage portion 42 (see step S2). The rotation motor 35 is then driven to adjust the bumper member 24 to the selected predetermined height level (see step S3).

Figure 7:
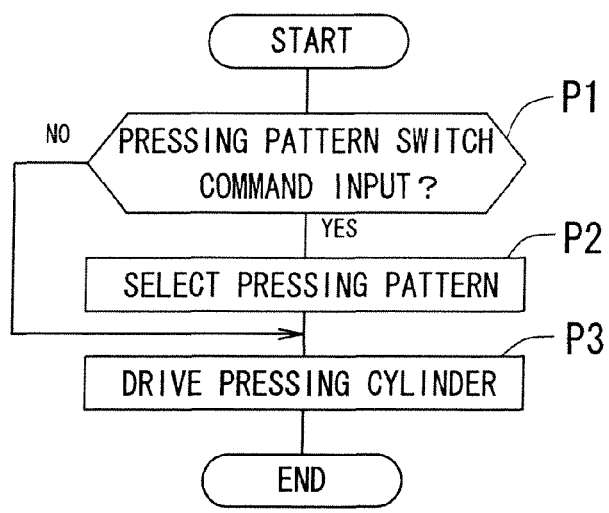
FIG. 7 is a flowchart illustrating pressing processing corresponding to the pressing pattern.

Further, the control portion 40 determines whether or not a pressing pattern switch command has been input through the input portion 41 (see step P1 of FIG. 7). When a pressing pattern switch command has been input through the input portion 41 (a determination of YES in step P1); the control portion 40 selects a predetermined pressing pattern corresponding to the switch command from among the plurality of pressing patterns stored in the pressing pattern storage portion 43 (see step P2). The pressing cylinder 22 is then driven to realize the selected predetermined pressing pattern (see step P3).

Here, the rotary member 31, rotation motor 35, female screw 29a, male screw 32a, height level storage portion 42, control portion 40, and so on of the working example described above can be said to constitute the elevating support mechanism of the present invention. Further, the third moving unit 18, pressing cylinder 22, pressing pattern storage portion 43, control portion 40, and so on of the working example described above can be said to constitute the pressing force adjustment mechanism of the present invention.

(2) Actions of Film Adhesion Device

Next, the actions of the film adhesion device 1 will be described.

First, processing to adjust the height level of the bumper member 24 will be described. When a height level switch command corresponding to the shape of the semiconductor wafer W in use is input into the control portion (see step S1 of FIG. 6), a predetermined height level corresponding to the switch command is selected (see step S2), whereupon the rotation motor 35 is driven (see step S3 of FIG. 6). As a result, the rotary member 31 is rotated about the central axis of the table 2, and the rotary force of the rotary member 31 is transmitted to the bumper member 24 via the engagement between the female screw 29a and male screw 32a. Thus the height of the bumper member 24 is adjusted to the predetermined height level such that the bumper member 24 is positioned at this height level.

Figure 4:
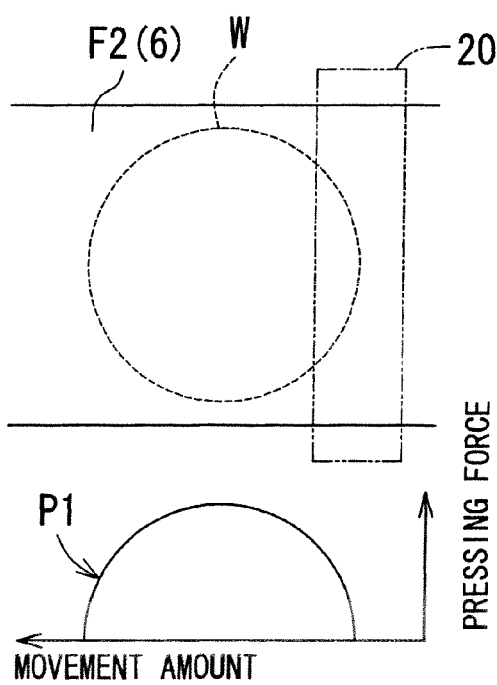
FIG. 4 is an illustrative view showing a pressing pattern.

Next, pressing pattern selection processing will be described. When a pressing pattern switch command corresponding to the shape of the semiconductor wafer W in use is input into the control portion 40 (see step P1 of FIG. 7), a predetermined pressing pattern corresponding to the switch command is selected (see step P2). Here, as shown in FIG. 4, a pressing pattern P1 corresponding to the circular planeform semiconductor wafer W is selected.

Next, film adhesion processing will be described. First, the first through third moving units 16, 17, and 18 (see FIG. 1) positioned at one end side of the slide shaft 15 are moved together toward the other end side of the slide shaft 15 and thereby positioned at the other end side (see FIG. 8). As a result, the two-layer film F2 supplied from the film supply portion 3 is applied to the surface side of the semiconductor wafer W on the table 2, and the two-layer film F2 is pressed against, and thereby adhered to, the surface of the semiconductor wafer W by the pressing roller 20 of the third moving unit 18 in the pressing pattern P1 (see FIG. 4). While pressing the two-layer film F2, the pressing roller 20 is moved while contacting the contact surface 24a of the height level-adjusted bumper member 24.

Figure 9:
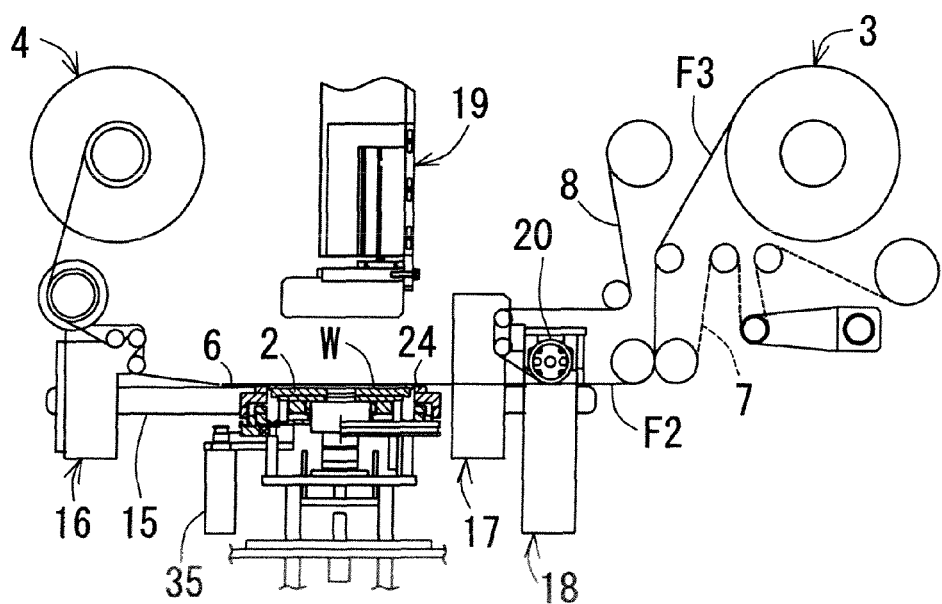
FIG. 9 is an illustrative view showing the actions of the film adhesion device.
Figure 10:
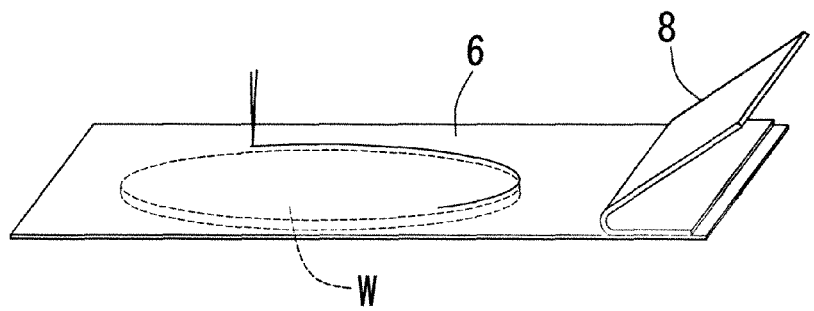
FIG. 10 is an illustrative view showing the actions of the film adhesion device.

Next, the second and third moving units 17 and 18 are caused to retreat to their original positions (see FIG. 9), whereby the reinforcing film 8 is peeled away from the two-layer film F2 on the semiconductor wafer W such that only the photoresist film 6 remains on the surface of the semiconductor wafer W. Next, the cutting unit 19 is moved in the horizontal plane along the outer peripheral edge of the semiconductor wafer W and caused to emit a laser in order to trim the photoresist film 6 (see FIG. 10). The surplus film is then wound onto the film winding portion 4, and thus the semiconductor wafer W affixed with photoresist constituted by a thin, flexible material is obtained.

Figure 11:
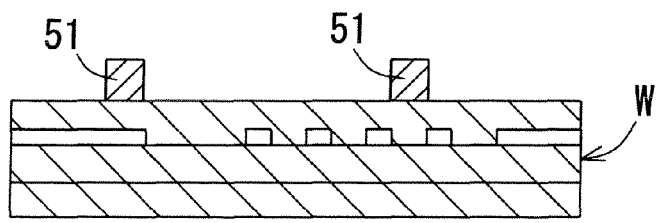
FIG. 11 is an illustrative view showing a hollow structure.
Figure 12:
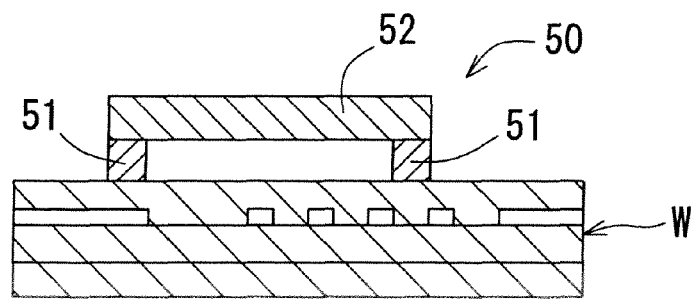
FIG. 12 is an illustrative view showing a hollow structure.

Exposure/removal processing and so on are then implemented on the photoresist adhered to the semiconductor wafer W to form precured wall portions 51 on the semiconductor wafer W (see FIG. 11). Next, a height level switch command corresponding to the semiconductor wafer W having the wall portions 51 is input into the control portion 40 to adjust the bumper member 24 to a predetermined height. Further, a pressing pattern switch command corresponding to the semiconductor wafer W having the wall portions 51 is input into the control portion 40 to select a predetermined pressing pattern. Next, the film adhesion processing described above is implemented on the semiconductor wafer W having the wall portions 51, whereby the semiconductor wafer W having photoresist adhered on top of the wall portions 51 is obtained. Exposure/removal processing and so on are then implemented on the photoresist of the semiconductor wafer W such that a hollow structure 50 constituted by the wall portions 51 and a roof portion 52 is formed on the semiconductor wafer W (see FIG. 12).

Note that in the working example described above, the height level and pressing pattern are modified from the first film adhesion process to the second film adhesion process, but the present invention is not limited thereto, and for example only one, or neither, of the height level and pressing pattern may be modified.

(3) Effects of the Working Example

In the film adhesion device 1 of this working example, the pressing roller 20 is brought into contact with the contact surface 24a of the height level-adjusted bumper member 24 while pressing the photoresist film 6, and hence the pressing roller 20 can be prevented from applying an excessive pressing force to the photoresist film 6. As a result, the photoresist film 6, which is constituted by a thin, flexible material, can be affixed in a multi-layer structure with minimal mechanical stress on the lower layer. Particularly when affixing the photoresist film 6 serving as the wall portions 51 of the hollow structure 50, irregularities (surface patterns) on the surface side of the semiconductor wafer W can be absorbed favorably so that mechanical stress on the semiconductor wafer W can be suppressed to a minimum, and when affixing the photoresist film 6 serving as the roof portion 52 of the hollow structure 50, irregularities (surface patterns) on the precured wall portions 51 can be absorbed favorably so that mechanical stress on the semiconductor wafer W and the wall portions 51 can be suppressed to a minimum. Further, the bumper member 24 is raised and lowered by the elevating support mechanism 25, including the rotary member 31, the rotation motor 35, the control portion 40, and so on, so as to be positioned at a predetermined height level, and hence the photoresist film 6 can be adhered to semiconductor wafers having various shapes with good stability. As a result, the hollow structure 50 can be formed with good yield on the semiconductor wafer W at an extremely thin film thickness (for example, approximately 50 μm or the like) and with excellent thickness precision. In particular, the hollow structure 50 can be formed favorably on substantially the entire surface of the semiconductor wafer W. Moreover, when three or more photoresist films are affixed to form a multi-layer structure, the hollow structure 50 can be formed with a high film thickness (for example, approximately 100 μm).

Further, in this working example the pressing force of the pressing roller 20 is adjusted in accordance with the pressing surface area of the semiconductor wafer W by the pressing force adjustment mechanism 21 constituted by the third moving unit 18, the pressing cylinder 22, the control portion 40, and so on, and hence the photoresist film 6 can be adhered to semiconductor wafers having a variety of shapes with good stability.

Also in this working example, the control portion 40 is provided with the height level storage portion 42 and the pressing pattern storage portion 43 such that a height level and a pressing pattern which correspond to the shape of the semiconductor wafer W in use are selected on the basis of input information input into the control portion 40. As a result, the photoresist film 6 can be adhered to semiconductor wafers having a variety of shapes with good stability.

Figure 13:
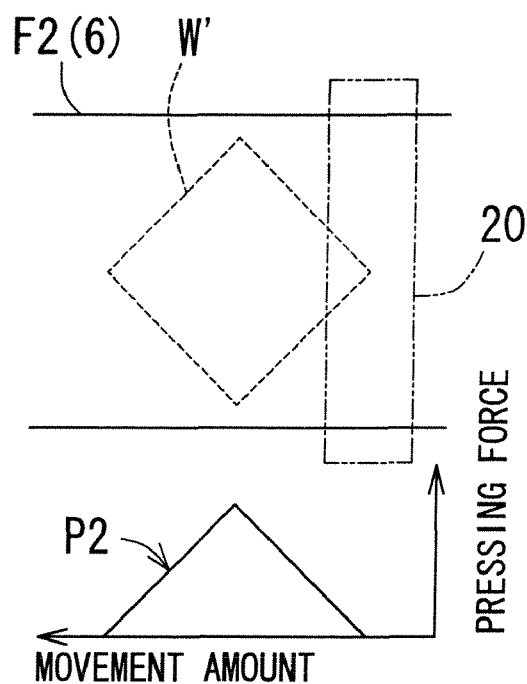
FIG. 13 is an illustrative view showing another aspect of the pressing pattern.

Note that the present invention is not limited to this working example, and various modifications may be made within the scope of the present invention according to the objects and applications thereof. For example, in the working example described above, the film is affixed in the curved pressing pattern P1 (see FIG. 4) to correspond to the circular semiconductor wafer W, but the present invention is not limited thereto, and the film may be affixed in a linear pressing pattern P2 to correspond to a rhomboid semiconductor wafer W', as shown in FIG. 13.

Figure 14:
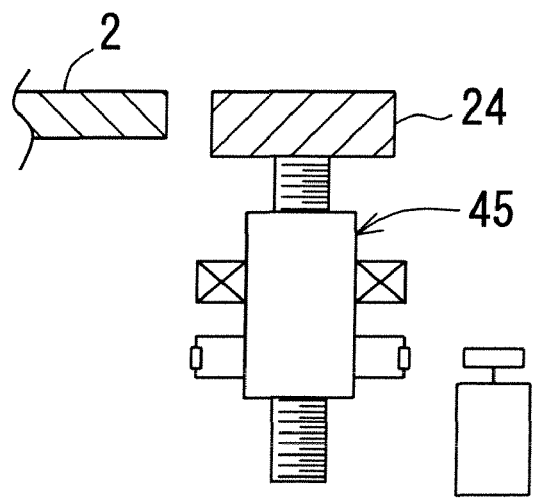
FIG. 14 is an illustrative view showing another aspect of an elevating support mechanism.
Figure 15:
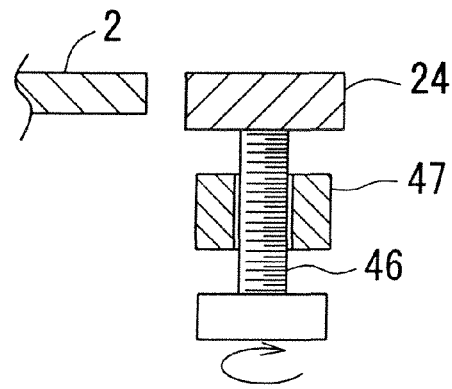
FIG. 15 is an illustrative view showing a further aspect of the elevating support mechanism.
Figure 16:
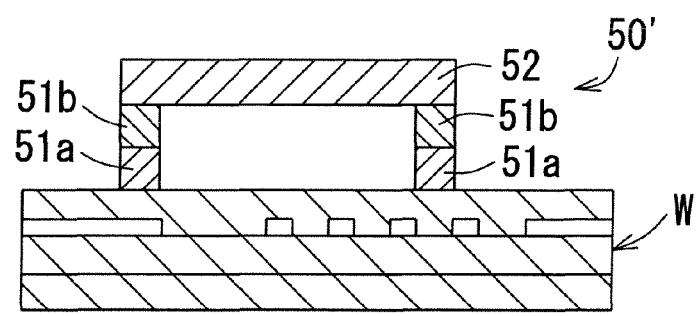
FIG. 16 is an illustrative view showing another aspect of the hollow structure.
Figure 17:
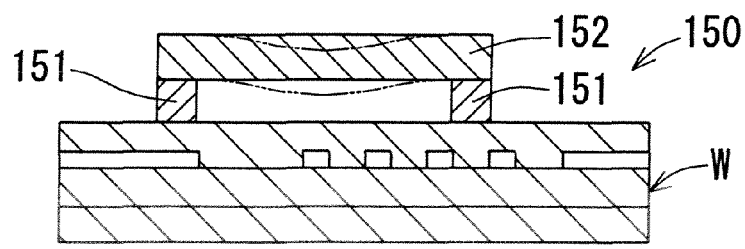
FIG. 17 is an illustrative view showing a conventional hollow structure.

Furthermore, in the working example described above the bumper member 24 is raised and lowered into position by the engagement between the male screw 32a provided on the side of the rotary member 31, which is supported so as to be free to rotate about the center of the table 2, and the female screw 29a provided on the bumper member 24 side, but the present invention is not limited thereto, and for example, the bumper member 24 may be raised and lowered into position via a ball screw mechanism 45, as shown in FIG. 14, or by the engagement between a screw shaft 46 and a nut member 47, as shown in FIG. 15. The bumper member may also be raised and lowered into position by an elevating cylinder, and positioned by a lock P1n, a hook portion, a clamping tool, or similar.

Further, in the working example described above photoresist is applied twice to form the hollow structure 50 comprising the wall portions 51 and roof portion 52 on the semiconductor wafer W, but the present invention is not limited thereto, and for example, photoresist may be applied three times to form a hollow structure 50' having a first wall portion 51a, a second wall portion 51b, and the roof portion 52. By applying photoresist four times or more, a hollow structure having an even higher cavity can be formed.

The present invention may be employed widely as a technique for forming a photoresist structure (for example, a hollow structure or the like) on a semiconductor wafer.

What is claimed is:

1. A multi-layer structure forming method using a film adhesion device, wherein said film adhesion device comprises:
    a table carrying a semiconductor wafer;
    a pressing member which presses a photo-resist film onto a surface side of said semiconductor wafer placed on said table;
    a bumper member provided on an outer peripheral side of said table and comprising a contact surface which is contacted by said pressing member when said pressing member presses said photo-resist film;
    an elevating support mechanism which supports said bumper member elevatably and positions said bumper member at a predetermined height level; and
    a pressing force adjustment mechanism which adjusts a pressing force of said pressing member in accordance with a pressing surface area of said semiconductor wafer,
    wherein said multi-layer structure forming method comprises the steps of:

step (1) for adjusting said height level of said contact surface of said bumper member by raising or lowering said bumper member using said elevating support mechanism such that said bumper is positioned at said predetermined height level;
    step (2) for pressing said photo-resist film onto said surface side of said semiconductor wafer placed on said table using said pressing member;
    step (3) for forming a wall portion on said semiconductor wafer implementing exposure/removal processing on said photo-resist film adhered to the semiconductor wafer;
    step (4) for adjusting said height level of said contact surface of said bumper member by raising or lowering said bumper member using said elevating support mechanism such that said bumper member is positioned at said predetermined height level corresponding to said semiconductor wafer having said wall portions; and
    step (5) for pressing said photo-resist film onto said surface side of said wall portion on said semiconductor wafer placed on said table using said pressing member,
    wherein in said step (2), said pressing member contacts said contact surface of said bumper member adjusted said height level, moves along a surface of said semiconductor wafer, and said pressing force of said pressing member is adjusted in accordance with said pressing surface area of said semiconductor wafer while said pressing member is moving;
    in step (5) said pressing member contacts said contact surface of said bumper member adjusted said height level, moves along a surface of said wall portion on said semiconductor wafer, and said pressing force of said pressing member is adjusted in accordance with said pressing surface area of said semiconductor wafer having said wall portion while said pressing member is moving.

2. The multi-layer structure forming method according to claim 1, wherein said pressing force adjustment mechanism comprises:
    a moving unit which supports said pressing member and is capable of moving along a surface of said semiconductor wafer;
    a pressing drive source for displacing said pressing member in a pressing direction; and
    a control portion which drive-controls said pressing drive source in accordance with said pressing surface area of said semiconductor wafer.

3. The multi-layer structure forming method according to claim 2, wherein said elevating support mechanism comprises:
    a rotary member supported so as to be free to rotate about a vertical axis of said table;
    a rotation drive source for rotating said rotary member; and
    a power transmission portion provided between said rotary member and said bumper member, which raises and lowers said bumper member using the rotation of said rotary member.

4. The multi-layer structure forming method according to claim 3, wherein said pressing force adjustment mechanism further comprising a pressing pattern storage portion which stores a plurality of pressing patterns determined in advance in accordance with the planar form and/or surface form of said semiconductor wafer, wherein
    said control portion is configured to drive said pressing drive source on the basis of an input pressing pattern switch command to set a predetermined pressing pattern from among said plurality of pressing patterns stored in said pressing pattern storage portion, wherein said elevating support mechanism further comprises:

a height level storage portion which stores a plurality of height levels of said bumper member determined in advance in accordance with the planar form and/or surface form of said semiconductor wafer, and a control portion for driving said rotation drive source on the basis of an input height level switch command such that said bumper member is adjusted to a predetermined height level from said plurality of height levels stored in said height level storage portion.

5. The multi-layer structure forming method according to claim 3, wherein said power transmission portion comprises:

a male screw provided on one of said rotary member and said bumper member; and a female screw provided on the other of said members and screwed to said male screw.

6. The multi-layer structure forming method according to claim 4, wherein said power transmission portion comprises:

a male screw provided on one of said rotary member and said bumper member; and a female screw provided on the other of said members and screwed to said male screw.

7. The multi-layer structure forming method according to claim 1, wherein said multi-layer structure is a hollow structure having said wall portion and a roof portion which is formed by implementing exposure/removal process on said photo-resist film adhered on top of said wall portions.

8. The multi-layer structure forming method according to claim 1, wherein said pressing member is a pressing roller.

* * * * *